United States Patent [19]

Rosenthal

[11] 3,958,135
[45] May 18, 1976

[54] CURRENT MIRROR AMPLIFIERS

[75] Inventor: Bruce David Rosenthal, Highland Park, N.J.

[73] Assignee: RCA Corporation, New York, N.Y.

[22] Filed: Aug. 7, 1975

[21] Appl. No.: 602,747

[52] U.S. Cl. ........................... 307/235 F; 307/297; 330/14; 330/30 D
[51] Int. Cl.² ...................... H03K 5/20; H03K 1/12
[58] Field of Search ............ 307/235 F, 235 H, 297, 307/268; 330/30 D, 22, 40, 14; 323/4

[56] References Cited
UNITED STATES PATENTS 3,848,139  11/1974  Holt, Jr. .......................... 307/235 F
3,925,718  12/1975  Wittlinger ..................... 307/297 X Primary Examiner—John Zazworsky
Attorney, Agent, or Firm—H. Christoffersen; S. Cohen; R. G. Coalter

[57] ABSTRACT

Feedback, derived from the rate-of-change of the output current of a current mirror amplifier, varies the mirror ratio as a function of the spectral content of the output current. The feedback is regenerative whereby the rate-of-change of the output current is enhanced. Selection of parameters of the mirror and output node provide optimal compensation for step function input currents.

13 Claims, 2 Drawing Figures

CURRENT MIRROR AMPLIFIERS

This invention relates to amplifiers and particularly to current mirror amplifiers.

Current mirror amplifiers (hereinafter CMA's) are well known and are widely used in applications requiring an accurately fixed relationship between an input current and one or more output currents. In an operational amplifier or comparator, for example, CMA's are typically employed to supply bias current to the various stages and to perform other functions such as level shifting or differential to single ended conversion in the input, intermediate or output stages.

Heretofore, CMA's have employed direct coupled transistors with degenerative feedback for regulating the output current in a fixed direct ratio to the input current. When used as a source of D.C. bias current, A.C. parameters of a CMA (such as bandwidth, response time and the like) may not be of paramount importance. Conversely, such parameters may be significant limiting factors in applications where the CMA must additionally respond to time varying components of an input signal as in, for example, the signal amplifying stages of a comparator. Accordingly, the present invention is directed to meeting the need for a CMA having improved response to time varying signal components.

Prior art comparators are known which employ a constant current source for supplying current to a pair of current splitting transistors and which include a CMA as the active load thereof. Heretofore it has been known that a speed improvement could be achieved in such comparators by means of regenerative feedback from the output terminal to the non-inverting input terminal via a suitable voltage divider. This means for enhancing speed degrades the D.C. input impedance at the non-inverting input terminal and introduces hysteresis which may be undesired. Where the feedback is A.C. coupled to avoid the hysteresis, the input impedance is nevertheless affected by the presence of the output signal via feedback to the non-inverting input terminal and that may result in troublesome complications in a system employing the comparator. Accordingly, the present invention is further directed to an improved comparator in which the input impedance is not affected by speed improvement elements and in which hysteresis is not necessary for the speed enhancement.

The invention is illustrated in the accompanying drawings wherein like elements are designated by like reference numbers and in which.

Figure 1:
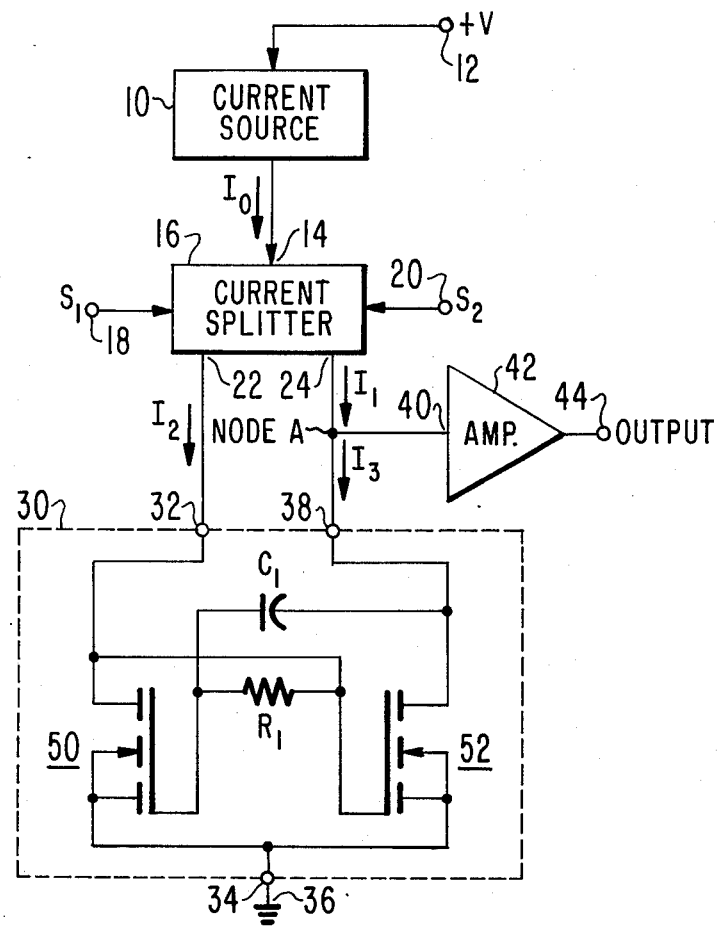
FIG. 1 is a circuit diagram of a comparator embodying the invention.

In the comparator of FIG. 1, current source 10 receives an operating potential +V from terminal 12 and supplies a current $I_o$, to input terminal 14 of current splitter 16. Current source 10 may comprise a resistor connected between terminals 12 and 14 but preferably is a constant current source. Such sources are well known in the art and include current mirror amplifiers biased by a constant input current for producing a constant output current in fixed ratio thereto.

Current splitter 16 apportions the input current $I_o$ between two output terminals, 22 and 24, in accordance with the relative magnitudes of input signals $S_1$ and $S_2$ applied to input terminals 18 and 20, respectively. When signals $S_1$ and $S_2$ are at the same potential, the output currents $I_1$ and $I_2$ (at terminals 24 and 22, respectively) are balanced, each being equal to $I_o/2$. When the input signals differ, the output currents are unbalanced. For purposes of explanation, it will hereafter be assumed that current $I_1$ increases and current $I_2$ decreases as the signal $S_1$ becomes more positive than signal $S_2$ (taken with respect to ground 36) and the reverse occurs when signal $S_2$ becomes more positive than signal $S_1$.

Current splitter 16 may be implemented by known circuit methods. It may comprise, for example, a pair of field-effect transistors having the source electrodes thereof connected in common at terminal 14, the drain electrodes thereof separately connected to output terminals 22 and 24 and the gate electrodes thereof separately connected to input terminals 18 and 20. Alternatively, it may comprise a pair of correspondingly connected bipolar transistors.

Output terminal 22 of current splitter 16 is connected to input terminal 32 of CMA 30 which is connected at the common terminal 34 thereof to ground 36. Output terminal 38 of CMA 30 is connected to current splitter output terminal 24 at node A and to the input terminal 40 of output amplifier 42. CMA 30 comprises a pair of N-channel field-effect transistors 50 and 52 connected at the drain electrodes thereof to terminals 32 and 38, respectively, and at the source and substrate electrodes thereof to common terminal 34. The gate electrode of transistor 50 is coupled to terminals 32 and 38 via resistor $R_1$ and capacitor $C_1$, respectively. The gate electrode of transistor 52 is coupled to the drain electrode of transistor 50.

In general terms, CMA 30 serves as an active load for current splitter 16 providing differential to single-ended conversion of the output currents $I_1$ and $I_2$ by withdrawing a current, $I_3$, from node A in proportion to the current $I_2$. Accordingly, for a mirror ratio of unity, the node A voltage will be relatively high when the $I_1$ current exceeds the $I_2$ current and relatively low when the reverse is true. If the mirror ratio ($I_3/I_2$) were always unity, there would be no distinction between the static and dynamic modes of circuit operation. That is, in either mode the rate of change of the node A voltage would be limited by the rate-of-change of the currents $I_1$ and $I_2$. That limitation is avoided in the comparator of FIG. 1 by regenerative feedback in CMA 30 which is derived from the rate-of-change of the mirror output current ($I_3$) and applied in a manner to effectively increase the mirror ratio with respect to time-varying components of the output current.

Viewed another way, the mirror ratio of CMA 30 is of a fixed value for D.C. components of the output current but varies as a function of the A.C. components thereof. This variation is of a sense to increase the rate of change of the output current. This results in substantially increased speed of operation of the comparator without the disadvantages, previously mentioned, associated with external feedback circuits. Additionally, as discussed in detail below, fully compensated step function response (i.e., response having minimal overshoot or undershoot) may be obtained by an appropriate choice of certain parameters of CMA 30 and output node A.

Operation of the comparator of FIG. 1 is most easily understood by initially considering the operation of CMA 30 alone. It will be seen that, operating independently, CMA 30 is characterized by a mirror ratio of unity under static signal conditions and greater than unity under dynamic signal conditions. (A third mirror ratio, less than unity, can be obtained under a particular static condition of the overall comparator operation due to an interactive relationship between CMA 30, current splitter 16 and amplifier 42).

Assume, therefore, that terminal 38 is disconnected from node A and coupled by suitable means (such as a resistor, not shown) to terminal 12. The current supplied to input and output terminals 32 and 38 are designated $I_2$ and $I_3$, respectively, and the mirror ratio is defined to be $I_3/I_2$, as before. Under these assumptions, the input current, $I_2$, causes the gate voltage of transistor 50 to assume a value sufficient to bias transistor 50 to conduct the input current to ground via the drain-to-source path thereof. Under static signal conditions, no current flows through resistor $R_1$ or capacitor $C_1$ so that the gates of transistors 50 and 52 are equally biased. Therefore, the output current, $I_3$, is conducted to ground via the drain-to-source path of transistor 52 in accordance with the transconductance ratio, $gm(52)/gm(50)$, of transistors 52 and 50.

The $I_3$ current, flowing through transistor 52 to ground, produces a voltage at the drain of transistor 52 which varies as $I_3$ varies. Under dynamic signal conditions, this voltage variation is applied directly to the gate of transistor 50 via capacitor $C_1$ and thence, via resistor $R_1$, to the gate of transistor 52. The effect, therefore, of this resistor-capacitor combination is to assure that more of the feedback is applied to the gate of transistor 50 where it is of a regenerative sense than is applied to the gate of transistor 52 where it is of a degenerative sense.

In more detail, assume that current $I_2$ increases from a quiescent value. This increases the bias at the gate of transistor 52 so that the $I_3$ current increases and the drain voltage of transistor 52 decreases. This reduction in voltage, coupled via capacitor $C_1$ to the gate of transistor 50 causes the drain-to-source resistance thereof to increase which, due to $I_2$ current flow therethrough, further increases the gate voltage of transistor 52. This feedback action is thus regenerative but decays exponentially as capacitor $C_1$ charges. Similar regeneration occurs for a change in the opposite sense of currents $I_2$ and $I_3$. Due to the exponential decay of the feedback voltage there is no possibility that CMA 30 can assume an undesired "latched" condition even though the feedback is regenerative.

Still considering CMA 30 separately, it has been found that an optimum relationship of circuit parameters exists where it is desired that the output voltage (not current) at terminal 38 faithfully reproduce a step function input signal with minimal overshoot or undershoot. It is to be recalled that the output current, $I_3$, is peaked momentarily by the regenerative feedback. This is because for steady state signals the mirror ratio is constant but increases during signal transition times. The effect of this, if the output node (terminal 38 for CMA 30 considered alone, node A in the comparator) were purely resistive, would be to produce a peaked output voltage, and thus overshoot would occur. On the other hand, if the output node were to have capacitive as well as resistive characteristics, overshoot, undershoot or perfect compensation could result by chance.

Where compensation for step function signals without relying on the element of pure chance is desired, the parameters of CMA 30 may be selected to a very close approximation according to the following relationship:

$$t_1 = t_2/(1 + gm_2R_2) \qquad (1)$$

where:
 $t_1$ is the $R_1C_1$ time constant;
 $t_2$ is a time constant $R_2C_2$ of the output node,
  $R_2$ being the net output nodal resistance,
  $C_2$ being the net output nodal capacitance; and
  $gm_2$ is the transconductance of transistor 52.

Overall operation of the comparator of FIG. 1 is as follows. Considering first the static operation, when signal $S_1$ is more positive than signal $S_2$, current $I_1$ is greater than current $I_2$. As previously described, the $I_2$ current flowing through the conduction path of transistor 50 to ground 36 produces a gate voltage at transistor 52 which biases transistor 52 to conduct an equal current $I_3$ to ground. Amplifier 40 may have either a low input impedance or a high input impedance. If the former, the node A voltage would increase slightly and the excess current $(I_1 - I_3)$ would flow into input terminal 40 causing the amplifier to produce a positive output signal. If the latter amplifier 40 would also produce a positive output signal but the node A voltage would increase until limited by the available operating potentials (due to Kirchoff's current law). As a practical matter, when current splitter 16 is implemented by the methods previously described, the maximum steady-state node A voltage is approximately equal to the potential of signal $S_2$.

Still considering static operation, when signal $S_2$ is more positive than $S_1$, current $I_2$ is greater than $I_1$. CMA 30 withdraws current $I_3$ from node A equal to $I_2$. If the input impedance of amplifier 40 were relatively low, the difference current $(I_3 - I_1)$ would flow from terminal 40 to node A and the amplifier would produce a low output voltage at terminal 44. If, on the other hand, the input impedance of amplifier 40 were relatively high (as is the case, for example, if amplifier 40 employs a field-effect transistor input stage) the amplifier would also produce a low output voltage but the node A voltage would decrease to approximately ground potential. Since the current $I_3$, under steady state conditions, must be equal to current $I_1$ if amplifier 40 is of the high input impedance kind, it follows that in this case (that is, $S_2 > S_1$) the steady state mirror ratio $(I_3/I_2)$ has to assume a value less than unity. This results because transistor 52 is "starved" of current, that is, although transistor 50 is primed to conduct a current equal to $I_2$, under these conditions, a current less than $I_2$ is being supplied to node A ($I_1$ is less than $I_2$ and amplifier 42, being of high input impedance, supplies little or substantially no current to node A).

Under dynamic operating conditions, feedback elements $R_1$ and $C_1$ serve, as previously described, to increase the rate-of-change of the current $I_3$ thereby enhancing the operating speed of the comparator. This advantage results without resort to external feedback paths with the attendant disadvantages thereof previously mentioned. The formula (equation 1), previously given, may be employed in the engineering design to determine the component values required fully to compensate the comparator, that is, to provide an ideal step response. The values $R_2$ and $C_2$, represent, as noted, the equivalent resistance and capacitance of the output node (node A) while $gm_2$ is the transconductance of transistor 52. Two techniques may be used to apply the formula. One may, for example, make reasonable estimates of $R_2$, $C_2$ and $gm_2$ from theoretical transistor models and published specifications. The calculation of $R_2$ and $C_2$ may, however, prove somewhat laborious. Fortunately, these parameters (as well as $gm_2$) are quite easily measured by known laboratory techniques. It is necessary, of course, when measuring these parameters to replace resistor $R_1$ with a negligible impedance and to remove capacitor $C_1$ from the circuit. Proper values may then be calculated for those components using equation 1. If very precise compensation is desired, $R_1$ or $C_1$ or both may be replaced by variable rather than fixed components.

Figure 2:
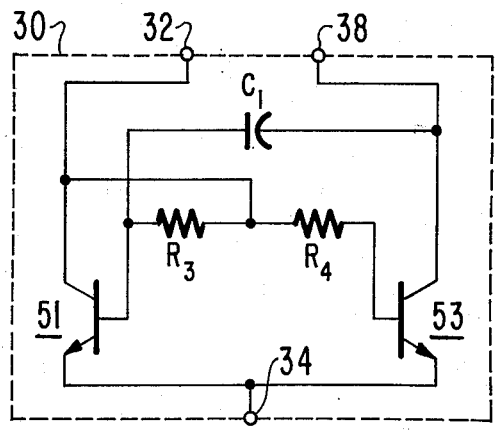
FIG. 2 is a circuit diagram illustrating a modification of the circuit of FIG. 1.

In a second embodiment of the invention, the CMA of FIG. 1 may be replaced by the CMA of FIG. 2. In the latter, the field-effect transistors 50 and 52 of the FIG. 1 circuit are replaced by bipolar transistors 51 and 53, respectively. Also, resistor $R_1$ is replaced by two resistors, $R_3$ and $R_4$. The emitters of transistors 51 and 53 are each connected to terminal 34 and the collectors thereof are respectively connected to terminals 32 and 38. Terminal 32 is connected to the bases of transistors 51 and 53 by resistors $R_3$ and $R_4$, respectively. Capacitor $C_1$ is connected between terminal 38 and the base of transistor 51.

Operation of CMA 30, thus modified, is in many respects the same as that previously described. Capacitor $C_1$, for example, provides a regenerative feedback signal to the base of transistor 51 as the collector current of transistor 53 changes. Resistors $R_3$ and $R_4$ provide the same function as resistor $R_1$ of effectively isolating the feedback signal from the base of transistor 52 where it would otherwise have a degenerative effect. Two resistors are employed here, rather than one, because in the quiescent state, unlike the previous example, there is a current flow and a corresponding voltage drop across the resistors. In other words, resistors $R_3$ and $R_4$ are the means by which base current bias is applied substantially equally to the control electrodes of transistors 51 and 53 in the quiescent state. This does not mean, however, that resistors 51 and 53 must in fact be equal valued since the $h_{IE}$ (the common emitter configuration static value of input resistance in hybrid parameter notation) of transistors 51 and 53 may differ. Accordingly, where transistors 51 and 53 are substantially similar, it is preferred that resistors $R_3$ and $R_4$ be nominally of equal values, but where the characteristics of transistors 51 and 53 differ appreciably, resistors $R_3$ and $R_4$ should be appropriately selected to achieve the desired mirror ratio (such as unity, in this example) under quiescent conditions.

It will be appreciated that although the CMA of the present invention has been illustrated in combination with a comparator, it may be used in other applications as well such as analog or digital level shifting applications or in any case where enhanced response to time-varying signals is described.

In constructing circuits according to the example of FIG. 1 it has been found that, as a practical matter, very little resistance and capacitance are needed to effect a substantial improvement in performance. The values, for example, may be on the order of a few picofarads and a few thousand ohms. Such values may be easily implemented directly in an integrated circuit by known techniques. Accordingly, the benefits of the invention may be realized in an integrated circuit without the necessity of externally connected (off chip) components.

What is claimed is:

1. A current mirror amplifier comprising, in combination:

an input terminal, a common terminal and an output terminal;

first and second transistors, each having a conduction path with first and second electrodes at the ends thereof and a control electrode, said second electrodes being connected to said common terminal, said input terminal being coupled to said first electrode of said first transistor, and said output terminal being coupled to said first electrode of said second transistor;

first circuit means coupled between said input terminal and said control electrode of said second transistor for providing a direct current conductive path therebetween;

first impedance means coupled between said input terminal and said control electrode of said first transistor for providing a direct current conductive path of limited conductivity therebetween; and a regenerative feedback path connected between said output terminal and said control electrode of said first transistor.

2. The combination recited in claim 1 wherein said regenerative feedback path comprises a capacitor.

3. The combination recited in claim 1 wherein said first and second transistors comprise two field-effect transistors, each having drain, source and gate electrodes correspondingly connected as said first, second and control electrodes.

4. The combination recited in claim 3 wherein said first circuit means is of negligible impedance and wherein said first impedance means is a resistor.

5. The combination recited in claim 1 wherein said first and second transistors comprise two bipolar transistors, each having collector, emitter and base electrodes correspondingly connected as said first, second and control electrodes.

6. The combination recited in claim 5 wherein said first impedance means and said first circuit means comprise, respectfully, first and second resistors.

7. The combination recited in claim 1 further comprising:

a current source for receiving an operating potential and producing an output current;

a current splitter, for receiving the output current and apportioning the output current between two output paths in accordance with the relative magnitudes of first and second signals supplied to said current splitter; and means coupling one of said paths to said input terminal and the other of said paths to said output terminal.

8. The combination recited in claim 7 further comprising an output amplifier having an input terminal coupled to the output terminal of said current mirror amplifier, said input terminal of said amplifier exhibiting an effective input impedance which is relatively high.

9. The combination recited in claim 7 further comprising an output amplifier having an input terminal coupled to the output terminal of said current mirror amplifier, said input terminal of said amplifier having an effective input impedance which is relatively low.

10. In a current mirror amplifier of the kind comprising an input transistor responsive to an input current, $I_1$, for producing a control signal and an output transistor responsive to the control signal for controlling the flow of an output current $I_2$ in direct ratio to the input current, the ratio $I_2/I_1$ being constant under steady-state current conditions, the improvement for increasing the ratio $I_2/I_1$ under transient current conditions, comprising:

means responsive to the rate-of-change of the output current and independent of the steady-state value thereof, for providing a regenerative feedback signal from the output transistor to the input transistor.

11. In a current mirror amplifier as set forth in claim 10, said input transistor having a control electrode and said output transistor an output electrode, and said means responsive to the rate-of-change of the output current comprising an alternating current coupling element connected between said two electrodes.

12. In a current mirror amplifier as set forth in claim 11, said means responsive to the rate of change of the output current comprising an element serving as the sole connection between said electrodes having a relatively low alternating current impedance and a relatively high direct current impedance.

13. In a current mirror amplifier as set forth in claim 12, said element comprising a capacitor.

* * * * *